United States Patent [19]
Wei

[11] Patent Number: 5,950,093
[45] Date of Patent: Sep. 7, 1999

[54] METHOD FOR ALIGNING SHALLOW TRENCH ISOLATION

[76] Inventor: Chi-Hung Wei, No. 1231-19, Ming-Hu Rd., Hsinchu, Taiwan

[21] Appl. No.: 09/223,327

[22] Filed: Dec. 30, 1998

[30] Foreign Application Priority Data

Aug. 18, 1998 [TW] Taiwan .................................. 87113554

[51] Int. Cl.$^6$ ..................................................... H01L 21/76
[52] U.S. Cl. ......................... 438/401; 438/427; 438/975; 148/DIG. 102
[58] Field of Search ..................................... 438/401, 427, 438/424, 975, FOR 227; 148/DIG. 102

[56] References Cited

U.S. PATENT DOCUMENTS 5,536,675  7/1996  Bohr .
5,733,801  3/1998  Gojohbori .
5,786,260  7/1998  Jang et al. ............................... 438/401
5,893,744  4/1999  Wang ...................................... 438/401

*Primary Examiner*—Teresa M. Arroyo
*Assistant Examiner*—Long Pham
*Attorney, Agent, or Firm*—Jiawei Huang; J.C. Patents

[57] ABSTRACT

A method for aliging a shallow trench isolation is provided. An aligning mark which is deeper than a prior technique is formed in a provided substrate. A trench is formed and an aligning trench is formed in the position over the aligning mark. A thick oxide layer is deposited on the semiconiductol substrate, in the trench and in the aligning trench. After a portion of the thick oxide layer removed, another portion of the thick oxide layer is removed by etching back. A gate oxide layer is formed on a substrate comprising the trench and the aligning trench. A polysilicon layer with the step-height profile in the position over the aligning mark is formed on the gate oxide layer.

20 Claims, 4 Drawing Sheets

METHOD FOR ALIGNING SHALLOW TRENCH ISOLATION

CROSS-REFERENCE TO RELATED APPLICATION

This application claims the priority benefit of Taiwan application Ser. No. 87113554, filed Aug. 18, 1998, the full disclosure of which is incorporated herein by reference.

BACKGROUND OF THE INVENTION

1. Field of the Invention

The invention relates in general to a method of forming semiconductor integrated circuits (ICs), and more particularly to a method of aligning of an aligner used during an isolation process.

2. Description of the Related Art

Sallow trench isolation (STI) structures are now widely used for IC devices isolation. Typically silicon nitride is used as a hard mask to etch a semiconductor substrate anisotropically to form a substantially vertical trench. The trench is filled with oxide to be a device isolation structure. The upper surface of the isolation structure is about at the same level as the top surface of the semiconductor substrate. The thickness of the STI structure provides effective isolation and is suitable for smaller size devices.

FIGS. 1A–1F are cross-sectional views showing steps of a conventional process of forming a shallow trench isolation structure. As shown in FIG. 1A, a semiconductor substrate 100 with an aligning mark 102 formed therein is provided. The aligning mark called "zero mark" is used for alignment and has a concave profile. A pad oxide layer 104 and a silicon nitride layer 106 are subsequently formed on the substrate 100.

In FIG. 1B, a defined photoresist layer 108 is provided over the silicon nitride layer 106. The silicon nitride layer 106 and the substrate 100 are partially removed with the defined photoresist layer 108 to form a trench 110 in the substrate 100.

In FIG. 1C, a side-wall oxide layer 111 is formed on the trench 110 side-wall after removing the defined photoresist layer 108. An oxide layer 112 with a thickness of about 7000 Å is formed by low pressure chemical vapor deposition (LPCVD) and densified at a temperature of 1000° C.

In FIG. 1D, a portion of the oxide layer 112 is removed by chemical mechanical polishing (CMP), using the silicon nitride layer 106 as a polishing stop layer so that the oxide layer 112a is left in the trench 110. In addition, some oxide 112b remained in the silicon nitride layer 106 in the aligning mark 102.

As shown in FIG. 1E, the CMP process provides an global planarized surface. Since the alignment for patterning a polysilicon layer on the structure shown in FIG. 1D is performed by optical theory of grating there must be a step-height profile at the aligning mark 102. The oxide 112b remained in the aligning mark 102 makes the underlying silicon nitride layer to be removed difficultly, so that in the conventional method for forming a STI structure the oxide 112b within the aligning mark 102 has to be cleared out. A photoresist layer 114 is provided over the structure shown in FIG. 1D with an opening aligned over the aligning mark 102. The oxide 112b remained in the aligning mark 102 and the exposed silicon nitride layer 106 are removed. Then, plasma is used to perform a cleaning step.

In FIG. 1F, the remained silicon nitride layer 106 and the pad oxide layer 104 are removed after removing the photoresist layer 114. A gate oxide layer 116 is formed on the structure surface after cleaning. Then, a polysilicon layer 118 with a step-height profile over the aligning, mark 102 is formed on the gate oxide layer 116.

The conventional process must use a clear-out process to remove silicon nitride on the aligning mark to make the polysilicon layer which is formed at the subsequent step having the step-height profile. The clear-out process requires the formation of a photoresist layer and many other steps. It does not only increase the consumption of materials (such as photoresist, etchant, etc.), and thus increases the fabrication cost, but also occupy a machine with a long operation time.

SUMMARY OF THE INVENTION

It is therefore an object of the invention to provide a method for aligning of shallow trench isolation. An etching back process is used to form a step-height profile at the aligning trench during, forming the STI structure. The invention can save cost without an additional clear-out process and other steps for alignment. Also, this invention can decrease the complexity of a STI process.

The invention achieves the above-identified objects by providing a method for aligning a shallow trench isolation. An aligning mark which is deeper compared to the prior technique is formed in a provided substrate. After a pad oxide layer and a silicon nitride layer formed, a photoresist layer is defined to form a trench pattern. At the same time, the photoresist layer over the aligning mark is cleared out. The trench is formed according to the trench pattern, and an aligning trench is formed at the position of the aligning mark. After removing the photoresist layer, a side-wall oxide layer is formed on the inner surface of the trench. A thick oxide layer is deposited on the side-wall oxide layer and on the silicon nitride layer. After removing a portion of the thick oxide layer, another portion of the thick oxide layer is removed to expose the silicon nitride layer by etching back. There is a step-height profile formed at the aligning trench during performing the steps described above. The remained silicon nitride layer and the pad oxide layer are removed. A gate oxide layer is formed on the substrate comprising the trench and the aligning trench. A polysilicon layer with the step-height profile is formed on the gate oxide layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
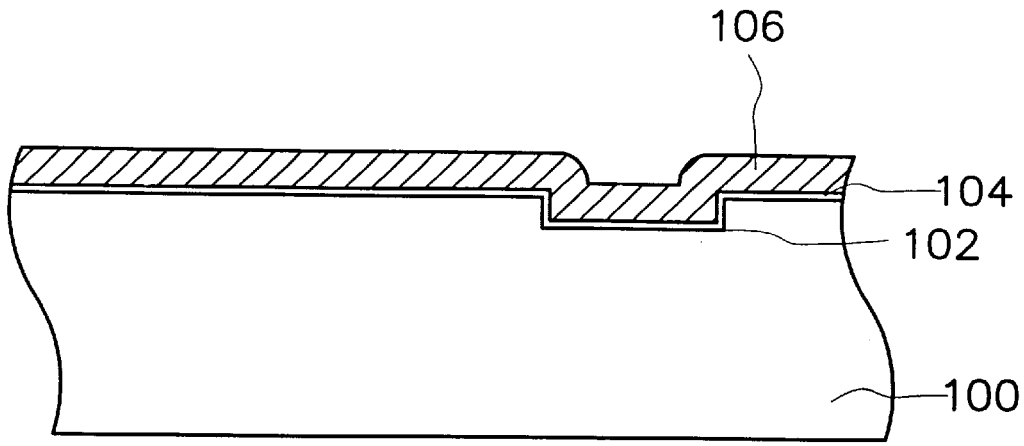
FIGS. 1A–1F are cross-sectional views showing steps of a conventional process of forming a shallow trench isolation structure.
Figure 1B:
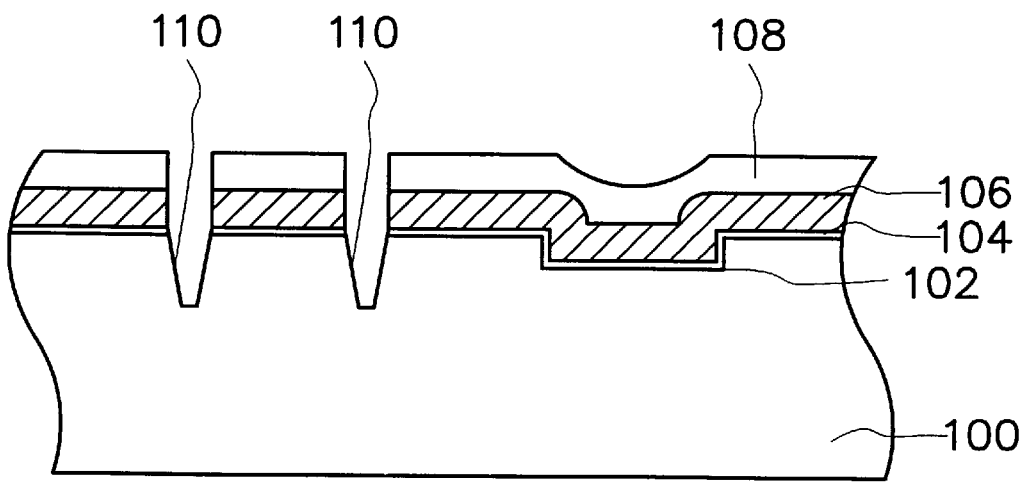
Figure 1C:
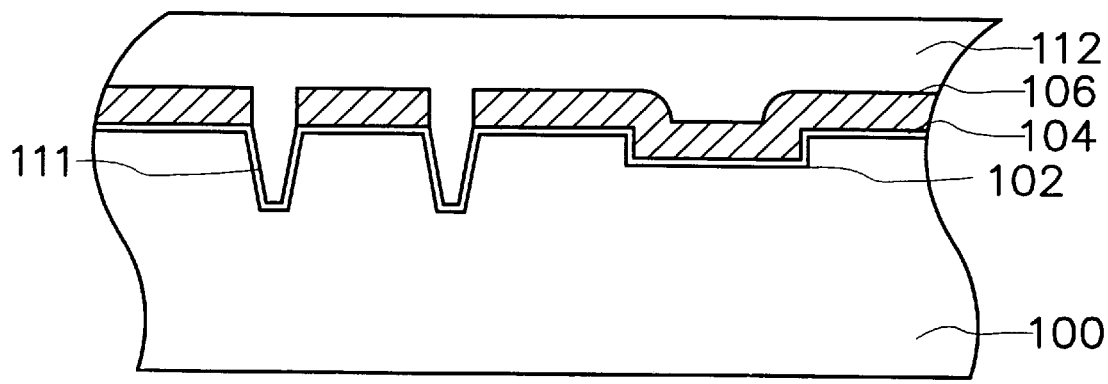
Figure 1D:
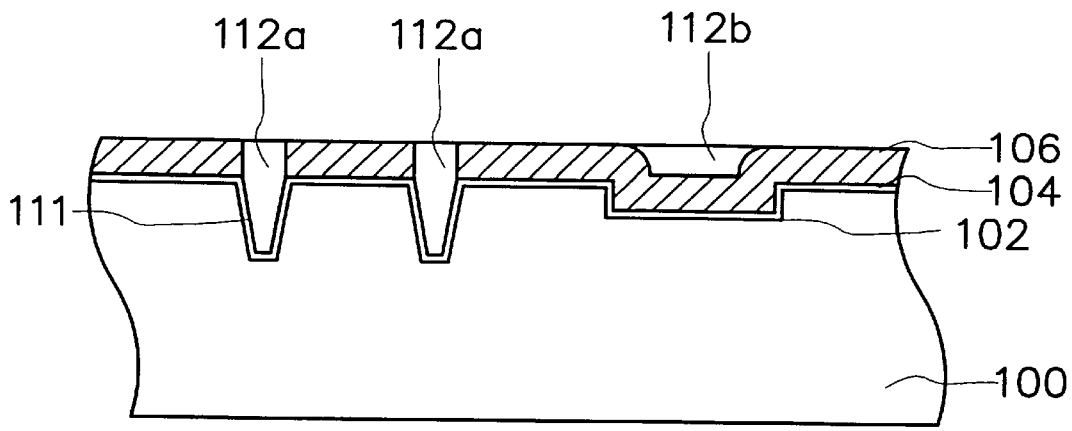
Figure 1E:
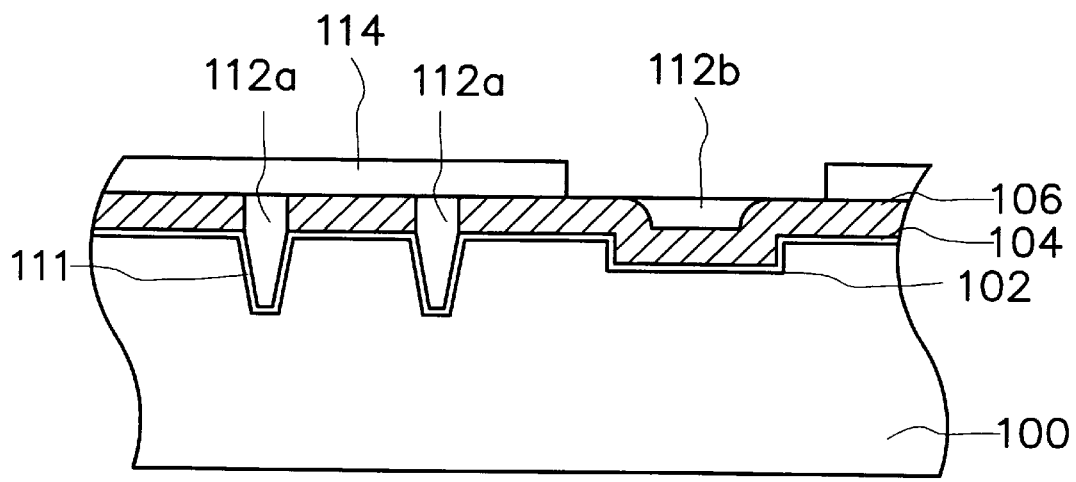
Figure 1F:
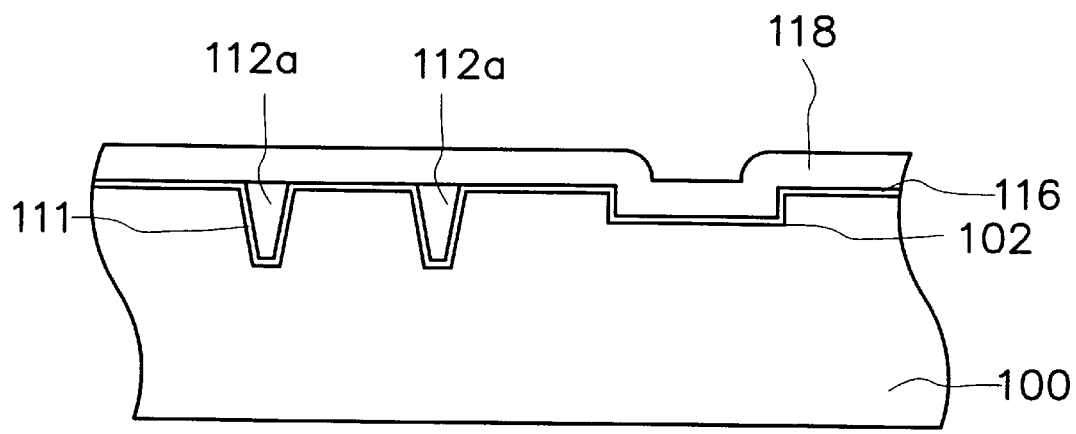
Figure 2A:
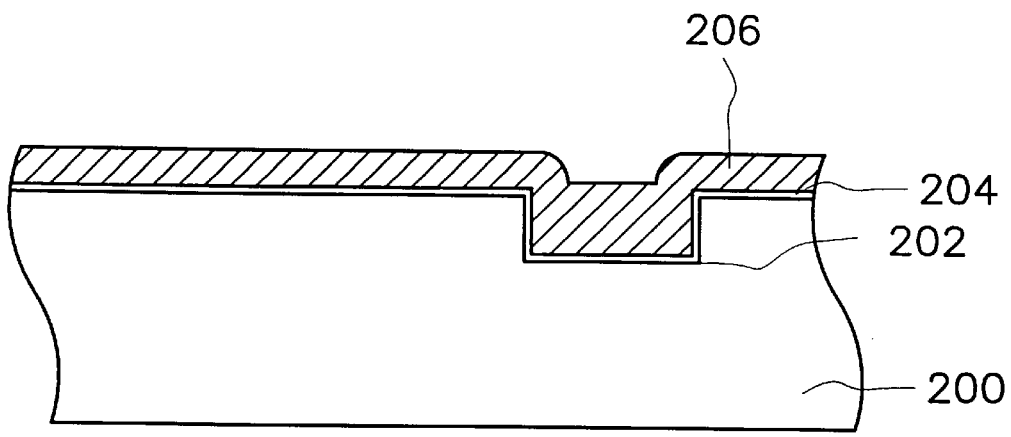
FIGS. 2A–2F are cross-sectional views showing the process steps of one preferred embodiment of the method for forming a shallow trench isolation structure.

Referring to FIG. 2A, a semiconductor substrate 200 is provided. An aligning mark 202 is formed in the semiconductor substrate 200. Preferably, the depth of the aligning mark 202 is about 2400 Å. A pad oxide layer 204 and a silicon nitride layer 206 are formed on the semiconductor substrate 200. The pad oxide layer 204 has a thickness of about 110 Å. The silicon nitride layer 206 has a thickness of about 1500 Å.

Figure 2B:
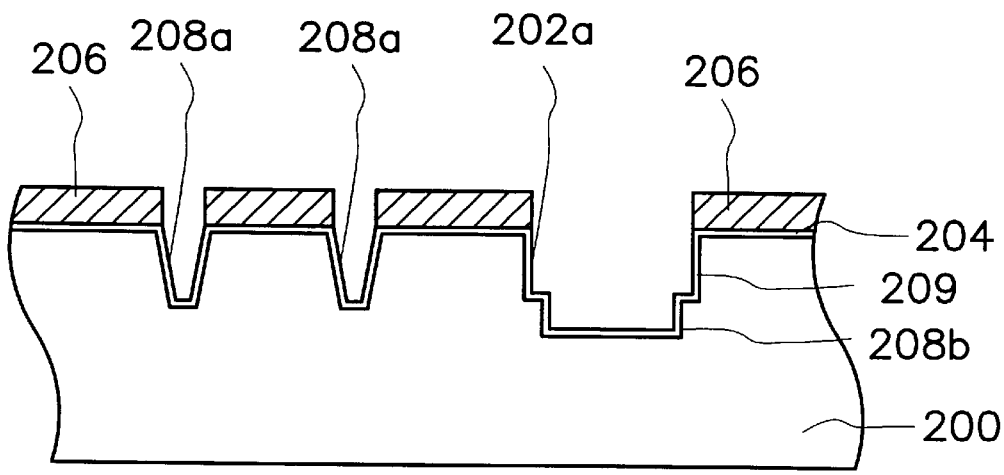

In FIG. 2B, a photoresist layer (not shown) is formed on the silicon nitride layer 206 to define a trench pattern and to expose the aligning mark 202. The uncovered silicon nitride layer 206 and a portion of the substrate 200 are removed to form a trench 208a in the substrate 200. At the same time, the exposed aligning mark 202 is etched to form an aligning, trench 208b with a depth of about 4000 Å in the substrate 200. By forming the aligning trench 208b, the aligning mark 202a extends downwardly to form a T-shape structure. That is, the T-shape structure is formed with an upper part of the aligning mark 202a and a lower part of the aligning trench 208. A side-wall oxide layer 209 with a thickness of about 300 Å is formed on the side-wall of the T-shape structure comprising the aligning mark 202a and the aligning trench 208b.

Figure 2C:
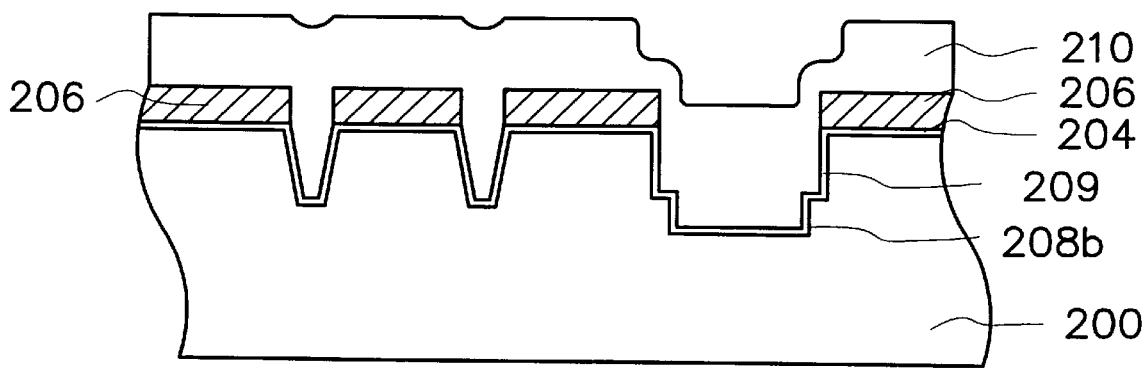

In FIG. 2C, a thick oxide layer 210 with a thickness about 7000 Å is formed, for example, by low pressure chemical vapor deposition (LPCVD) on the structure as shown in FIG. 2B. The surface level of the thick oxide layer 210 in the position over the aligning trench 208b is higher than the surface level of the pad oxide layer 204.

Figure 2D:
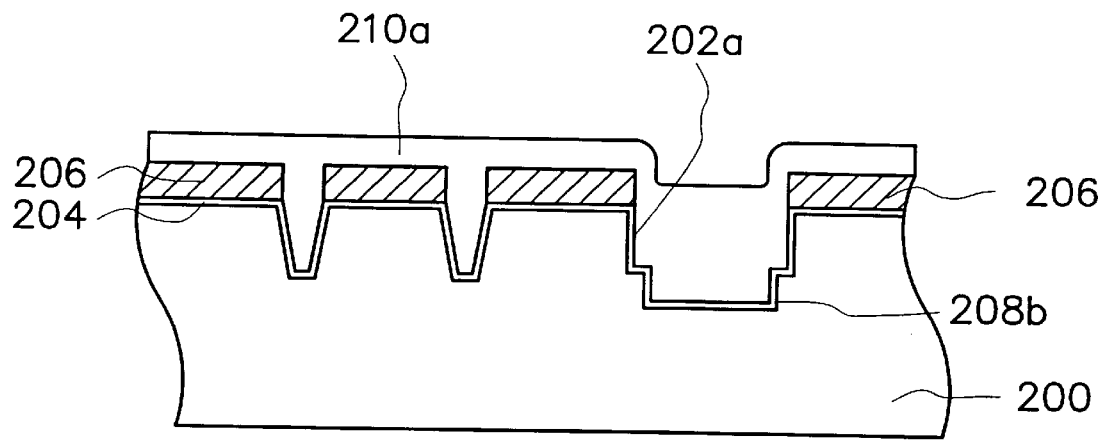

In FIG. 2D, a polarization process such as CMP is performed. A portion of the thick oxide layer 210 is removed to remain the oxide layer 210a with a thickness of about 1000 Å on the silicon nitride layer 206.

Figure 2E:
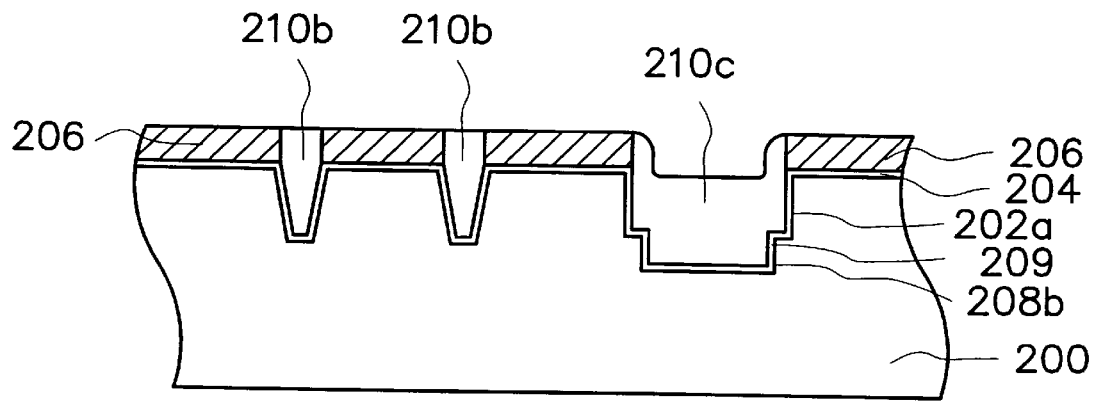

As shown in FIG. 2E, the remained thick oxide layer 210a on the silicon nitride layer 206 and a portion of the thick oxide layer 210a filled in the aligning trench 208b are removed, for example, by etching back. A first oxide plug 210b is formed in the trench 208a and a second oxide plug 210c with a thickness of about 5000 Å is formed in the aligning trench 208b. The depth of the T-shape structure comprising the aligning mark 202a and the aligning trench 208b is about 6400 Å. But the thickness constituted from the second oxide plus 210c and the side-wall oxide layer 209 is about 5300 Å so that the top surface of the second plug 210c is lower than the top surface of the substrate 200.

Figure 2F:
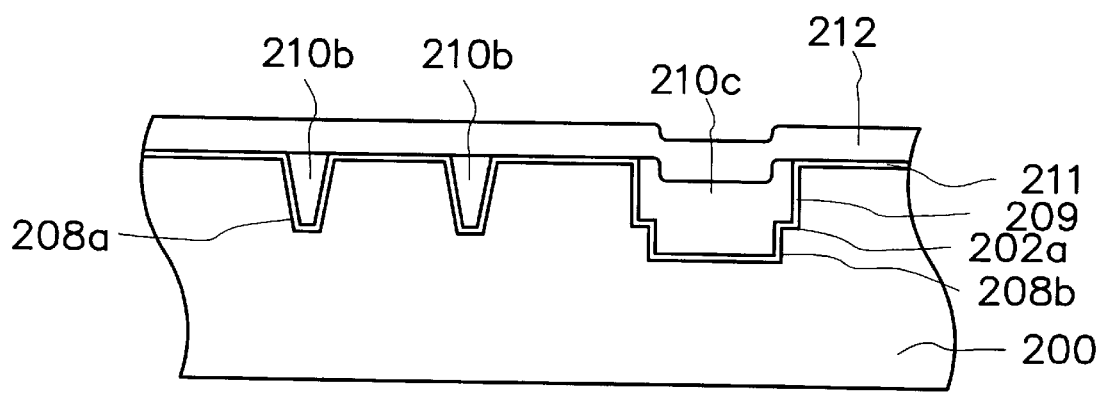

In FIG. 2F, a gate oxide layer 211 with a thickness of about 60 Å is formed on the substrate 200 after the silicon nitride layer 206 and the pad oxide layer 204 removed. A polysilicon layer 212 with a thickness of about 3000 Å is formed on the gate oxide layer 211. Since the surface level of the second plug 210c is lower than the surface level of the substrate 200, the polysilicon layer 212 formed thereon has a step-height profile.

The invention provides a method for aligning a shallow trench isolation. An aligning mark is provided and an aligning trench is formed during forming the trench. The aligning mark and the aligning trench combine a T-shape structure. The aligning is not necessary deeper than a prior technique, but the top surface of the oxide layer in the T-shape structure must be lower than the top surface of the silicon nitride layer. That can provides a step-height profile for alignment while a polysilicon layer is formed on the oxide layer. The method doesn't need an additional photoresist layer and other processes to clear-out and to form a step height configuration at the aligning mark, so that the method can reduce the cost of materials and can reduce the process steps.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for aligning a shallow trench isolation, comprising the steps of:

providing a semiconductor substrate;

forming a deep alignment mark in the semiconductor substrate;

forming a pad oxide layer and a silicon nitride layer on the semiconductor substrate;

removing the silicon nitride layer, the pad oxide layer and the semiconductor substrate partially to form a trench in the semiconductor substrate and to form a aligning trench within the aligning mark, wherein the aligning mark and the aligning trench compose a T-shape structure;

forming side-wall oxide layers on a side-wall of the trench and on a side-wall of the aligning trench;

forming a thick oxide layer on the silicon nitride layer and on the side-wall oxide layers;

performing a planarization to remove a portion of the thick oxide layer;

removing the thick oxide layer remained on the silicon nitride layer to form a first oxide plug in the trench and to form a second oxide plug in the aligning trench, wherein a top surface of the second oxide plug is lower than a top surface of the semiconductor substrate;

removing the silicon nitride layer and the pad oxide layer;

forming a gate oxide layer on the semiconductor substrate; and forming a polysilicon layer on the gate oxide layer.

2. The method according to claim 1 wherein the aligning mark has a depth of about 2400 Å.

3. The method according to claim 1, wherein the aligning, trench has a depth of about 4000 Å.

4. The method according to claim 1, wherein the side-wall oxide layers have a thickness of about 300 Å.

5. The method according to claim 1, wherein the thick oxide layer has a thickness of about 7000 Å.

6. The method according to claim 1, wherein said planarization process comprises a CMP process.

7. The method according to claim 1, wherein the gate oxide layer has a thickness of about 60 Å.

8. The method according to claim 1, wherein the polysilicon layer has a thickness of about 3000 Å.

9. A method for aligning a shallow trench isolation, comprising the steps of:

providing a semiconductor substrate comprising an aligning mark with a substantially deep step height;

forming a trench in the semiconductor substrate and a aligning trench in the position under the aligning mark, wherein the aligning mark and the aligning trench compose a T-shape structure;

forming side-wall oxide layers on a side-wall of the trench and on a side-wall of the aligning trench; and forming a first oxide plug in the trench and a second oxide plug in the aligning trench, wherein a top surface of the second oxide plug is lower than a top surface of the semiconductor substrate.

10. The method according to claim 9, wherein the method further comprises steps after forming the first plug and the second plug, the step comprising:

forming a gate oxide layer on the semiconductor substrate; and forming a polysilicon layer on the gate oxide layer.

11. The method according to claim 9, wherein the aligning mark has a depth of about 2400 Å.

12. The method according to claim 9, wherein the aligning trench has a depth of about 4000 Å.

13. The method according to claim 9, wherein the sidewall oxide layers have a thickness of about 300 Å.

14. The method according to claim 9, wherein the second oxide plug has a thickness of about 5000 Å.

15. The method according to claim 9, wherein the gate oxide layer has a thickness of about 60 Å.

16. The method according to claim 9, wherein the polysilicon layer has a thickness of about 3000 Å.

17. A method for aligning a shallow trench isolation, comprising the steps of:

providing a semiconductor substrate comprising a alignment mark;

forming trench in the semiconductor substrate and an aligning trench at the aligning mark, wherein the aligning mark and the aligning trench compose a T-shape structure; and forming a first oxide plug in the trench and a second oxide plug in the aligning trench, wherein a top surface of the second oxide plug is lower than a top surface of the semiconductor substrate.

18. The method according to claim 17, wherein the aligning mark has a depth of about 2400 Å.

19. The method according to claim 17, wherein the aligning trench has a depth of about 4000 Å.

20. The method according to claim 17, wherein the second oxide plug has a thickness of about 5000 Å.

* * * * *